US007164534B2

(12) United States Patent
Augustyn et al.

(10) Patent No.: US 7,164,534 B2
(45) Date of Patent: *Jan. 16, 2007

(54) DIFFUSER PLATE AND METHOD OF MAKING SAME

(75) Inventors: Walter H. Augustyn, Monroe, CT (US); Richard A. Gontin, Rye, NY (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/183,847

(22) Filed: Jul. 19, 2005

(65) Prior Publication Data

US 2005/0248743 A1    Nov. 10, 2005

Related U.S. Application Data

(63) Continuation of application No. 10/688,923, filed on Oct. 21, 2003, now Pat. No. 7,002,747.

(60) Provisional application No. 60/440,053, filed on Jan. 15, 2003.

(51) Int. Cl.
*G02B 5/18* (2006.01)
(52) U.S. Cl. .................. 359/572; 359/565; 359/575; 378/34
(58) Field of Classification Search ............... 359/572, 359/565, 575, 566; 430/5; 378/34, 35
See application file for complete search history.

(56) References Cited

U.S. PATENT DOCUMENTS

| 5,486,950 | A | 1/1996 | Collinge |
| 5,641,593 | A | 6/1997 | Watanabe et al. |
| 5,958,629 | A | 9/1999 | Yan et al. |
| 6,057,082 | A | 5/2000 | Korth |
| 6,072,631 | A | 6/2000 | Guenther et al. |
| 6,163,405 | A | 12/2000 | Chang et al. |
| 6,392,792 | B1 | 5/2002 | Naulleau |

(Continued)

FOREIGN PATENT DOCUMENTS

EP    1 106 972 A1    6/2001

(Continued)

OTHER PUBLICATIONS

Bjorkholm, J.E., "EUV Lithography—The Successor to Optical Lithography?", Intel Technology Journal Q3'98, pp. 1-8.

(Continued)

*Primary Examiner*—Fayez G. Assaf
(74) *Attorney, Agent, or Firm*—Sterne, Kessler, Goldstein & Fox P.L.L.C.

(57) ABSTRACT

An electromagnetic radiation diffuser, operative at extreme ultraviolet (EUV) wavelengths, is fabricated on a substrate. The diffuser comprises a randomized structure having a peak and valley profile over which a highly reflective coating is formed. The reflective coating substantially takes the form of the peak and valley profile beneath it. An absorptive grating can be fabricated over the reflective coating. The grating spaces will diffusely reflect electromagnetic radiation because of the profile of the randomized structure beneath. The absorptive grating will absorb the electromagnetic radiation. The grating thus becomes a specialized Ronchi ruling that may be used for wavefront evaluation and other optical diagnostics in extremely short wavelength reflective lithography systems, such as EUV lithography systems.

34 Claims, 5 Drawing Sheets

U.S. PATENT DOCUMENTS

| | | |
|---|---|---|
| 6,506,526 B1 | 1/2003 | Stivers et al. |
| 6,686,098 B1 | 2/2004 | Czech et al. |
| 2001/0051304 A1 | 12/2001 | Stivers et al. |
| 2003/0081316 A1 | 5/2003 | Goldberg et al. |

FOREIGN PATENT DOCUMENTS

| | | |
|---|---|---|
| EP | 1 197 803 A2 | 4/2002 |
| EP | 1 197 803 A3 | 4/2002 |
| EP | 1 237 041 A2 | 9/2002 |
| EP | 1 237 041 A3 | 9/2002 |
| JP | 2000-266914 | 9/2000 |

OTHER PUBLICATIONS

Goldberg, K.A., et al., "Extreme ultraviolet interferometry: at-wavelength testing of optics for lithography," The Advanced Light Source, 1998, at http://www-als.lbl.gov/als/compendium/AbstractManager/uploads/ACF4B6D.pdf, 4 pages.

Goldberg, K.A., et al., "Extreme ultraviolet interferometry: measuring EUV optical systems with sub-A accuracy," The Advanced Light Source, 2001, at http://www.als.lbl.gov/als/compendium/AbstractManager/uploads/01125.pdf, 3 pages.

Kolb, R., "EUV Lithography Making Possible Next Generation of Semiconductors," Sciencebeat [online], Jun. 5, 2001, at http://www.lbl.gov/Science-Articles/Archive/euv_milestone.html (visited Jan. 12, 2003), 4 pages.

Lee, S. H., *High Accuracy EUV Interferometry*, at http://buffy.eecs.berkeley.edu/IRO/Summary/99abstracts/shlee.1.html (visited Jan. 12, 2003), 1 page.

Mansuripur, M., "The Ronchi Test," MM Research, Inc., at http://www.mmresearch.com/articles/article1 (visited Jan. 9, 2003), 12 pages (also published in *Optics & Photonics News*, Jul. 1997, pp. 42-46).

*Measurement Science in the Extreme Ultraviolet: Testing Advance Optics for Printing Integrated Circuits*, at http://www.als.lbl.gov/als/actrep/FileH.pdf (visited Jan. 12, 2003), 2 pages.

Naulleau, P. P., et al., "Fabrication of high-efficiency multilayer-coated binary blazed gratings in the EUV regime," *Optics Communications*, vol. 200, Dec. 15, 2001, Elsevier Science B.V., pp. 27-34.

Wyant, J. C., "White Light Extended Source Shearing Interferometer," *Applied Optics*, vol. 13, No. 1, Jan. 1974, pp. 200-202.

Search Report from the European Patent Office for European Patent Application No. 04000512.6-2217, mailed Jan. 3, 2005 (3 pages).

Search Report from the Danish Patent and Trademark Office for Singapore Patent Application No. 200400112-9, mailed Aug. 20, 2004 (7 pages).

English-language abstract for Japanese Patent Application No. 2000-266914, published Sep. 29, 2000, from www.espacenet.com, 1 page.

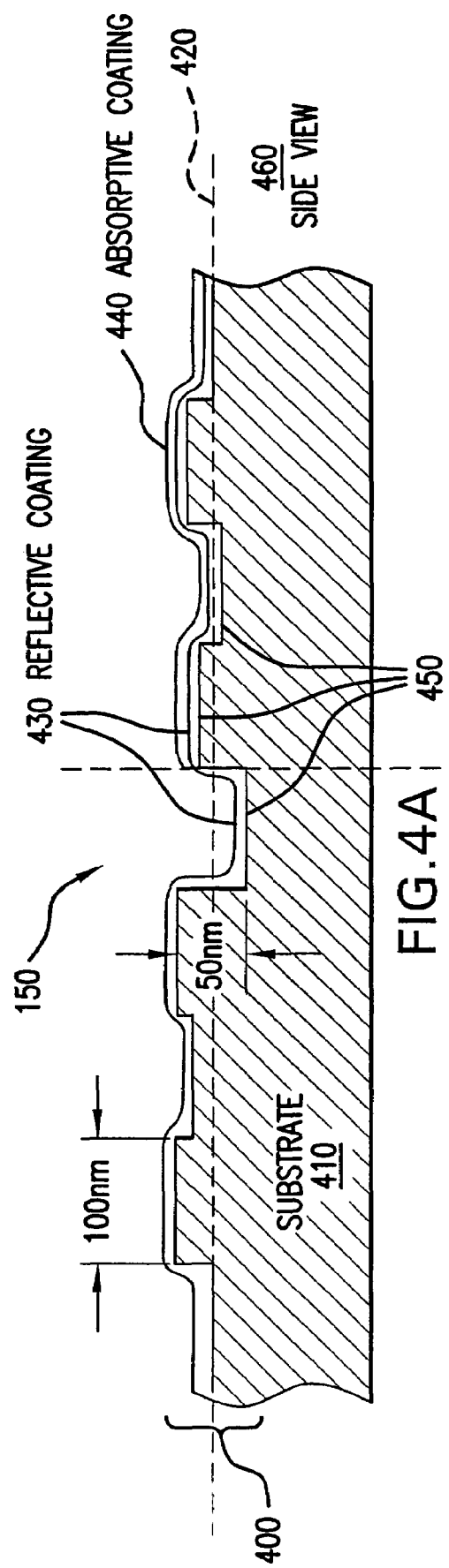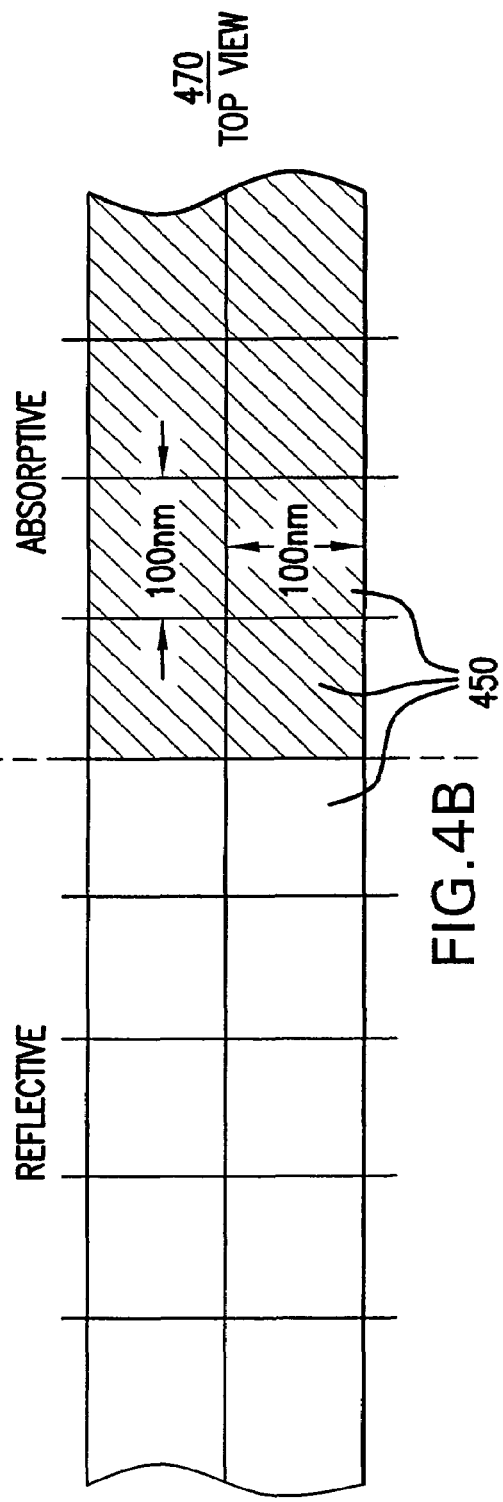

DIFFUSER PLATE AND METHOD OF MAKING SAME

CROSS-REFERENCE TO RELATED APPLICATIONS

This application is a continuation of U.S. patent application Ser. No. 10/688,923, filed Oct. 21, 2003 now U.S. Pat. No. 7,002,747, which claims the benefit of U.S. Provisional Pat. Appl. No. 60/440,053, filed Jan. 15, 2003, each of which is incorporated by reference in its entirety herein.

BACKGROUND OF THE INVENTION

1. Field of the Invention

The present invention is generally related to extremely short wavelength photolithography systems and, more particularly, to diffusely reflecting electromagnetic radiation in extreme ultraviolet (EUV) lithography systems.

2. Related Art

Lithography is a process used to create features on the surface of substrates. Lithography is a well known process in the art of manufacturing computer chips. A frequently used substrate for computer chips is a semiconductor material such as silicon or gallium arsenide. During lithography, a semiconductor wafer situated on a stage within a lithography tool is exposed to an image projected onto the surface of the wafer by an exposure system. The exposure system typically includes a reticle (also called a mask) for projecting an image of circuit features onto the wafer.

The reticle is generally located between the semiconductor wafer and a light source. The reticle is usually situated on a reticle stage within the lithography tool and is typically used as a photo mask for printing a circuit on a semiconductor chip. A light source shines through the mask and then through a series of optical lenses that reduce the image. This small image is then projected onto the semiconductor wafer. The process is similar to that used in a camera, which bends light to form an image on the photographic film.

The light plays an integral role in the lithographic process. For example, in the manufacture of microprocessors, one key to creating more powerful microprocessors is to reduce the wavelength of light used in the photolithographic process. A shorter wavelength allows the manufacture of smaller devices. Smaller devices, in turn, allow more transistors and other circuit elements to be etched onto a single silicon wafer, which yields more powerful, faster devices.

However, constantly shrinking wavelengths have yielded a number of challenges to chip manufacturers. For instance, the shorter wavelength of light, the more the light is absorbed in the glass optics intended to focus the light. As a result of this phenomenon, some light may fail to reach the silicon wafer, resulting in a degraded circuit pattern being created on the silicon wafer. As the wavelengths approach the extreme ultraviolet region of about 11–14 nanometers, glass material becomes more absorptive. For photolithography in this region-called Extreme Ultraviolet Lithography (EUVL)—glass lenses are replaced by mirrors, and the optical system is reflective, rather than refractive.

The problem of measuring the quality of the EUV illumination beam is a persistent one in EUVL applications. The use of shearing interferometry is one traditional method of optical system analysis. Use of shearing interferometry in refractive optical systems is well known. For a reflective optical system, such as is used in EUVL, various problems can arise. For example, in certain applications such as wavefront diagnostics, shearing interferometry requires a diffuse light source in the EUV range. Traditional refractive light diffusers do not work at such short wavelengths. It would be beneficial, then, to construct a reflective electromagnetic radiation diffuser that is operative at the extremely short wavelengths of EUVL systems.

SUMMARY OF THE INVENTION

The present invention is directed to a reflective electromagnetic radiation diffuser that is effective at extremely short wavelengths, such as those of EUVL systems.

An embodiment of the present invention comprises a reflective electromagnetic radiation diffuser fabricated on a substrate. The diffuser comprises a structure having a three dimensional profile of individual grid units over which a highly reflective coating is formed. The reflective coating substantially takes the form of the three dimensional profile beneath it. This embodiment could be used where there is a need for a diffuse source of EUV light, for example. Another embodiment includes an absorptive grating that is formed over the reflective coating. Spaces in the grating will diffusely reflect incident electromagnetic radiation because of the three dimensional profile of the individual grid units beneath. The absorptive grating will absorb the remainder of the electromagnetic radiation incident thereon. The grating thus becomes a specialized Ronchi ruling that can be used for wavefront evaluation and other optical diagnostics in a reflective lithography system.

A method is also disclosed for making an electromagnetic radiation diffuser. A substrate is provided upon which a three dimensional profile having individual grid units is fabricated. A reflective coating is then formed over the three dimensional profile such that the reflective coating substantially conforms to the profile upon which it rests. In one embodiment of the method, an absorptive grating is formed over the reflective coating. This absorptive grating allows optical diagnostics, such as a Ronchi test, to be performed on the incident wavefront.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention, are incorporated in and constitute a part of this specification, illustrate embodiments of the invention and together with the description serve to explain the principles of the invention. Like numbers refer to like components throughout, and the first numeral represents the figure in which that element first appears. In the drawings:

FIGS. 4A and 4B show two views of an embodiment of the randomized structure peak and valley profile.

DETAILED DESCRIPTION OF EMBODIMENTS OF THE INVENTION

Reference will now be made in detail to the embodiments of the present invention, examples of which are illustrated in the accompanying drawings.

Figure 1:
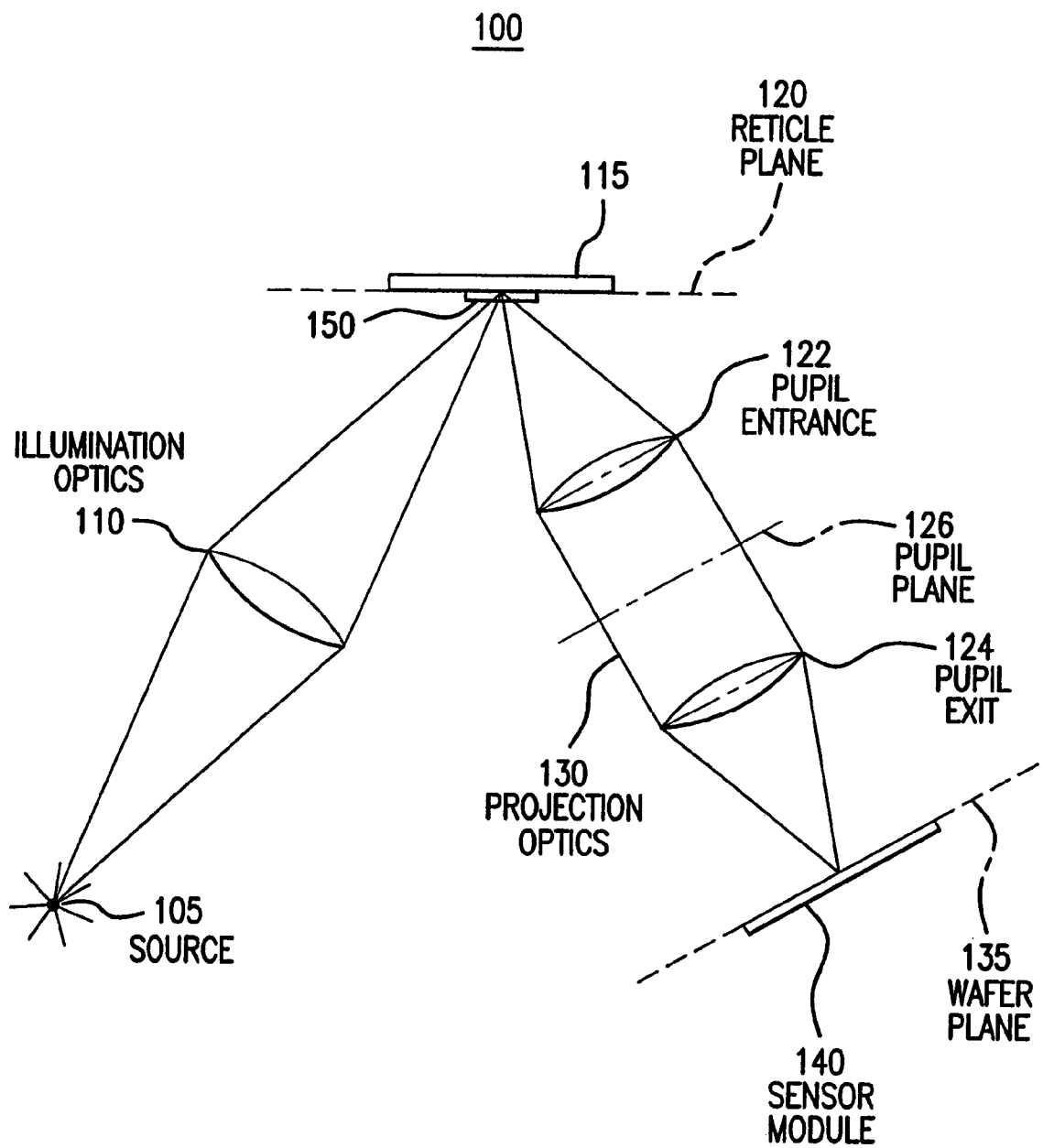
FIG. 1 shows a portion of a photolithographic system having a diffuser according to an embodiment of the present invention.

FIG. 1 illustrates a portion of a representative photolithographic system 100. System 100 is shown in a system test configuration. A source 105 provides electromagnetic radiation to the illumination optics 110. In the exemplary EUV embodiment, the illumination optics are reflective because of the very short EUV wavelengths. The illumination optics 110 focus the electromagnetic radiation on a reticle stage (not shown) which is located at the reticle plane 120. A reticle stage (not shown) ordinarily holds the reticle during lithography. Instead of a reticle mounted at the reticle plane 120, a source module 115 is mounted. This is preferred for initial system setup. The test configuration is also preferred for system diagnostics if the system capabilities are reduced during lithography as a result of thermal distortions or element motions due to the heat loads.

In the test configuration, the electromagnetic radiation diffuser 150 of the present invention, which is disposed on the source module 115, is located at reticle plane 120. The projection optics 130 capture the reflected diffuse electromagnetic radiation from the electromagnetic radiation diffuser 150 and image this reflection at a wafer plane 135. Projection optics 130 can include a pupil entrance 122 and pupil exit 124 with an intermediate pupil plane 126 as shown. A sensor module 140 is located at the wafer plane. It will be appreciated that electromagnetic radiation diffuser 150 is reflective in EUV systems, unlike photolithographic systems operating at longer wavelengths, such as deep ultraviolet or visible, where the reticle is usually transmissive.

In an embodiment of the invention, electromagnetic radiation diffuser 150, with an absorptive grating superimposed, can function as a specialized Ronchi grating. A Ronchi test is a well known method of testing optical systems. In a Ronchi test, a beam of light is brought into focus in an optical system that is undergoing tests to determine its aberrations. A diffraction grating (Ronchi grating) is placed perpendicular to the optical axis in the vicinity of the focus, which breaks up the incident beam into several diffraction orders. The diffracted orders propagate, independently of each other, and are collected by a pupil relay lens (mirror in a reflective system), which forms an image of the exit pupil of the object under test at the observation plane. In the exemplary embodiment of the test configuration, the observation plane is located just behind the wafer plane 135.

Figure 2:
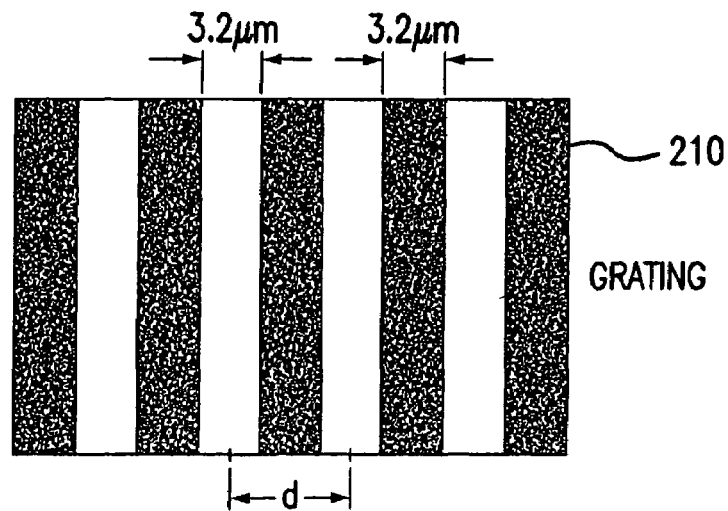
FIG. 2 shows an exemplary Ronchi optical grating.
Figure 3A:
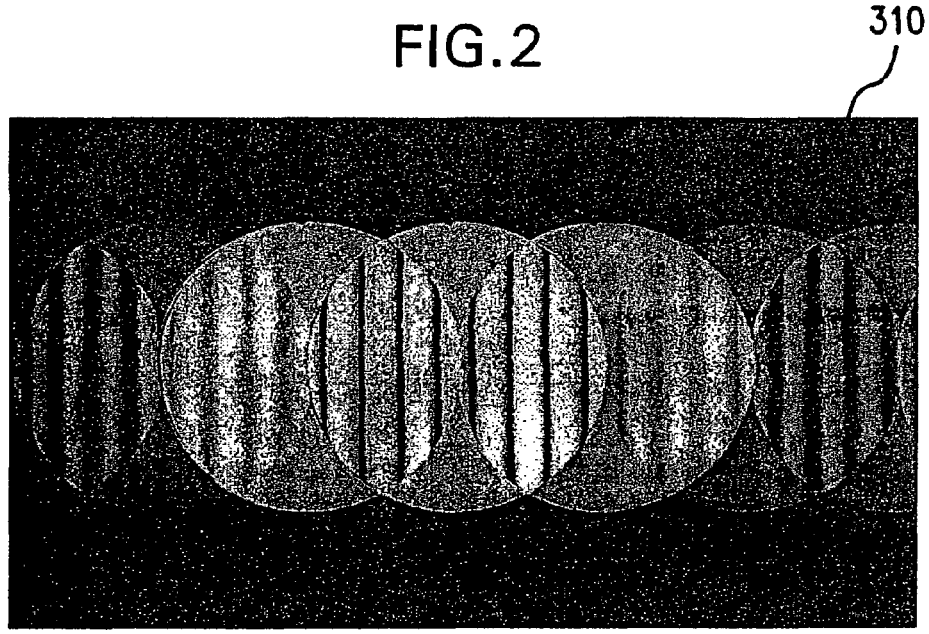
FIGS. 3A and 3B show a desired shearing interferometry result.
Figure 3B:
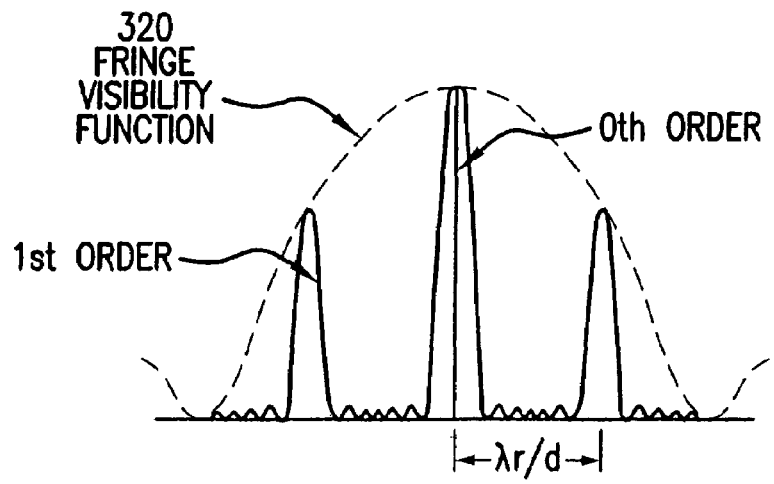

FIG. 2 shows a Ronchi-shaped grating 210 that can be implemented on electromagnetic radiation diffuser 150 according to an embodiment of the invention. FIGS. 3A–3B illustrate a desired result when shearing interferometry is implemented in an optical system, such as optical system 100, to perform a Ronchi test.

As shown in FIG. 2, in a preferred embodiment, the Ronchi grating 210 is 3.2 microns wide and repeats every 6.4 microns (e.g. grating period d=6.4 microns). Grating 210 is conjugate to a shearing grating located on the sensor module 140 at the wafer plane 135. The Ronchi-shaped grating 210 on the source module 115 is imaged by the projection optics 130 at a similar shearing grating at the wafer plane 135. As shown in FIG. 3A, the relative alignment of one grating with respect to the other produces a shearing interferogram 310 with fringes of intensity proportional to the slope of errors in the wavefront. Relative movement of the gratings produces a time-dependent phase-stepped shearing interferogram. Such movement can be performed by computer control of one or both of the reticle and wafer stages. The resulting interference pattern 310 has a fringe visibility function 320, as shown in FIG. 3B. The fringe visibility or coherence distribution function is given by the Fourier transform of a Ronchi grating ruling. The peaks represent those areas where the fringe contrast is highest. See, for example, J. C. Wyant, "White Light Extended Source Shearing Interferometer," *Applied Optics*, vol. 13, no. 1, January 1974, pp. 200–202. The diffractive order is determined by the pathlength of the ray. For example, in a first order maximum, the pathlength of each ray differs by plus-or-minus one wavelength from that of its neighboring ray. In a third order maximum, the pathlength of each ray differs by plus-or-minus three wavelengths from that of its neighboring ray.

In order to measure the wavefront, the reticle stage is moved relative to the wafer stage or the wafer stage is moved relative to the reticle stage in order to produce phase stepping that alters the interference pattern 310 in a controlled way. A CCD detector (not shown) below, or on, the sensor module 140 then receives and measures the transmitted radiation. The source module 115 can then be moved by the reticle stage to place a different diffraction grating in the optical path, so as to measure the wavefront with an orthogonal orientation of the source module grating 210. From these observations, diagnostic testing the optical system can be performed.

The occurrence of facets in a wavefront is one problem that may occur in an extremely short wavelength environment, such as an EUVL system, due to the unique character of the reflective illumination optics. For instance, the wavefront at the pupil entrance 122 may be faceted. Depending on the light source used, the facets will be a distributed array of illumination peaks surrounded by dark regions. For example, a large volume source would tend to produce large facets separated by nearly equally large dark spaces. As the source volume gets smaller so will the size of the illuminated facets relative to the dark regions in between. In either case, the facets are distributed evenly over the pupil. It will be apparent to those skilled in the art of wavefront metrology and shearing interferometry that such a faceted wavefront will negatively affect the shearing interferogram 310. The light intensity at the sensor module 140 would be non-uniform. These facets, if uncorrected, would propagate to the interferogram 310, and affect the signal-to-noise (SNR) ratio of the fringe visibility function 320. This would have a detrimental effect on the shearing interferometry process.

The problem of a faceted wavefront can be overcome by the use of a diffuse reflector (diffuser) at the reticle plane. Diffuse electromagnetic radiation is radiation that is redirected or scattered such that it is evenly distributed at the wavefront. Thus, redirecting and scattering the light with an electromagnetic radiation diffuser according to the present invention permits the pupil entrance to be uniformly filled even though the illumination system produces a faceted wavefront. In cases where the incident illumination is of lower numerical aperture (NA) than that of the projection optics under test, the diffuse reflection will still ensure proper pupil fill. In effect then, the invention adapts the NA of the illumination source to the requirements of the shearing interferometer.

FIG. 4A illustrates a cross-sectional view 460 of one embodiment of an electromagnetic radiation diffuser according to the present invention. FIG. 4B illustrates a top view 470 of individual grid units 450. A structure 400 having a three-dimensional profile of individual grid units is fabricated on a surface of a substrate 410. The individual grid units 450 (also called steps) have a varying height over a predetermined range referenced to a null substrate plane 420 of substrate 410. In one embodiment, the heights are selected randomly before fabrication, then formed on the substrate 400 using a technology such as electron beam lithography. Known algorithms can be used to mathematically determine or calculate the random height profiles of each grid unit 450. The randomly selected step heights that form the peak and valley profile are illustrated by randomized structure 400. As described in this preferred embodiment, the randomized structure 400 can be analogized to a three dimensional grid, or checkerboard, where each of the squares vary in height or depth, either randomly, or according to a pre-selected algorithm. This controlled structure 400, which is formed on substrate 410, forms the foundation of the electromagnetic radiation diffuser.

Figure 5:
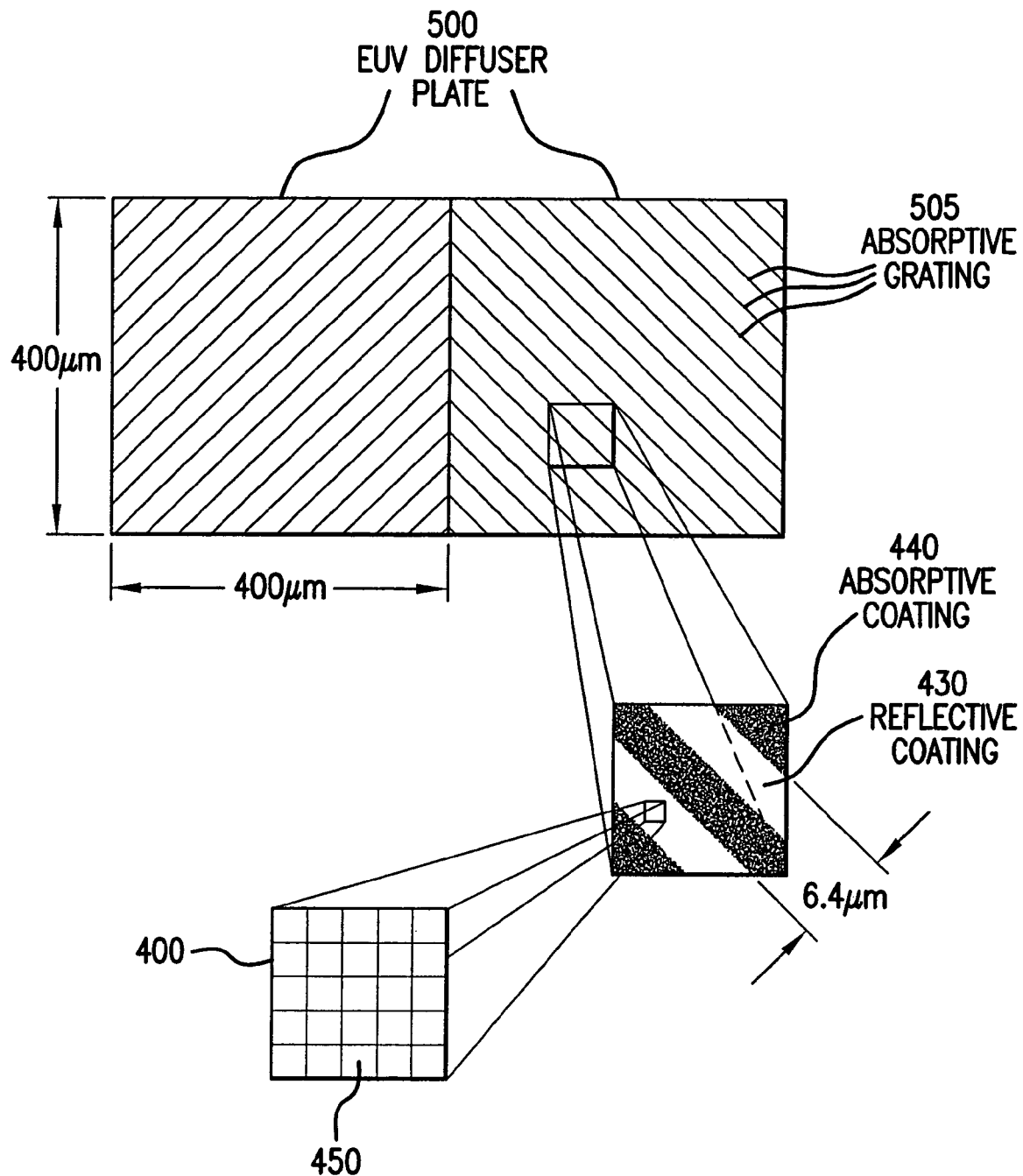
FIG. 5 shows an embodiment of an electromagnetic radiation diffuser plate with grating for shearing interferometry.

In a preferred embodiment, the height range of the individual steps 450 is approximately plus-or-minus 25 nanometers from a null substrate plane 420. Thus the range of heights from the lowest step to the highest is approximately 50 nanometers. The area of each individual step 450 is approximately 100 nanometers by 100 nanometers. As depicted in FIG. 5, the area of one diffuser plate 500 is approximately 400 microns by 400 microns. The specific structure of the preferred embodiment is unique to the short wavelengths of EUVL systems. At longer wavelengths, the exemplary structure would appear completely smooth, and would not diffuse incident electromagnetic radiation.

Two parameters of special importance are the wavelength of the electromagnetic radiation to be diffused, and the amount of angular diffusion required. These determine the average area of individual steps 450, as well as the probability distribution that controls the randomized variation in the three dimensional profile of the structure. Depending on these parameters, one skilled in the art would be able to design any number of different three dimensional grid shaped structures using techniques known in the art, given this description.

Fabrication of the multileveled surface 400 having the peak and valley profile arranged in a grid can be achieved through a variety of methods. The structure 400 can be formed directly on the top surface (i.e. the first surface) of substrate 410. For example, a series of pattern-and-etch steps is followed where the step height is controlled by the etch time. Using such methods, it is possible to generate $2^N$ levels using N pattern-and-etch steps. Alternatively, one or more layers can be formed on the first substrate 410, and the structure 400 can be formed in the one or more layers. Natural etch depth control can be obtained by first depositing a multi-layer composed of two materials having good relative etch selectivity properties. The number of layers in the deposited multi-layer should be greater than or equal to the number of desired levels in the final structure, and the thickness of the individual layers should match the desired step height variation. One exemplary method of manufacturing illustrating the use of multiple layers is disclosed in U.S. Pat. No. 6,392,792B1 to Naulleau, which is incorporated herein by reference.

A preferred fabrication method uses single pattern step which involves writing multilevel profile patterns directly into photoresist which then serves as a stable substrate for the randomized structure 400. The ideal resist material is very smooth to reduce unwanted scatter from the reflective coating. For example, hydrogen silsesquiozane (HSQ) photoresist has an attainable roughness lower than 1 nm rms. HSQ is made by Dow Corning, Inc., of Midland, Mich.

Over the three dimensional profile of structure 400, a highly reflective coating 430 is formed by evaporation or other known techniques. This coating can be formed of materials that reflect electromagnetic radiation in the EUV range such as molybdenum silicon (MoSi). MoSi may be deposited using known magnetron sputtering techniques. The reflective coating 430 substantially conforms to the shape of the peak and valley profile of structure 400 upon which it rests. Incident electromagnetic radiation would thus be diffusely reflected off this surface. It will be appreciated by those skilled in the art that some smoothing of the three dimensional profile of structure 400 will occur because of the reflective coating 430.

An absorptive coating 440 is then formed over a portion of the reflective coating 430 to create an optical grating 505. Depending on the thickness of the absorptive coating 440, it will conform to the shape of the reflective coating 430 beneath. However, the smoothing affect mentioned above with respect to the reflective coating 430 is not a concern for the absorptive grating 440 because of the relatively large feature sizes, as depicted in FIG. 5.

As depicted in FIG. 5, the absorptive coating 440 is applied in the form of a grating, or a striped pattern, and is present over only a certain portion of the reflective coating 430. The portion of the reflective coating 430 covered by the grating depends on the desired characteristics of the optical grating 505. The side view 460 depicted in FIG. 4A illustrates the portion of the diffuser that is covered by the absorptive grating 505. The absorptive material typically used is silicon nitride which is made thick enough for the absorption of the electromagnetic radiation incident thereon.

FIG. 5 illustrates the macro structure of a diffuser plate 500 with an overlying absorptive grating 440. One or more diffuser plates 500 can be mounted on source module 115 to make up electromagnetic radiation diffuser 150. Two separate diffuser plates 500 are shown with orthogonally oriented absorptive gratings 505. In one embodiment, the absorptive grating 505 is approximately 3.2 microns wide and repeats approximately every 6.4 microns, thus making the reflective space between the grating 3.2 microns wide. In an alternative embodiment, the absorptive grating 505 has a width of approximately 6.4 microns, and repeats approximately every 12.8 microns, thus making the reflective space between the grating 505 approximately 6.4 microns wide. One skilled in the art will recognize that the size and periodicity of the grating will depend on the particular needs of the testing to be performed. For example, the size of the grating could be determined by the amount of shear required for a particular test. Gratings of different sizes could be formed without departing from the spirit and scope of the present invention.

Absorptive grating 505 is typically oriented diagonally across the randomized structure 400 and typically extends across the entire diffuser plate 500 area. As shown, there are reflective regions between the absorptive grating 505, which diffusely reflect electromagnetic radiation due to the peak and valley profile of the randomized structure 400 that lies beneath. The size and orientation of the grating depends on not only the wavelength of the electromagnetic radiation but on other parameters used in shearing interferometry, as would be apparent to one skilled in the art.

The net result of the above disclosure is an engineered reflective electromagnetic radiation diffuser 150, operative at EUV wavelengths. Overlaid on the diffuser plate 500 is an absorptive grating 505 that acts as a specialized Ronchi ruling for use in optical analysis of extremely short wavelength lithographic systems, such as an EUVL system. Referring back to FIG. 1, electromagnetic radiation from source 105 is provided to source module 115. Source module 115 contains an electromagnetic radiation diffuser 150 that includes one or more diffuser plates 500. Electromagnetic radiation will be diffusely reflected to the projection optics 130, and an image of the absorptive grating 505, free of facets, will be present at the sensor module 140 for wavefront analysis using, for example, shearing interferometry. The desired interferogram 310 can thus be used for a variety of optical diagnoses.

In an alternative embodiment, the absorptive grating 505 may be omitted. In this embodiment, the grid shaped peak and valley profile of structure 400 with the reflective coating 430 would act as an electromagnetic radiation diffuser that could be used where there is a need for a diffuse source of EUV light.

Figure 6:
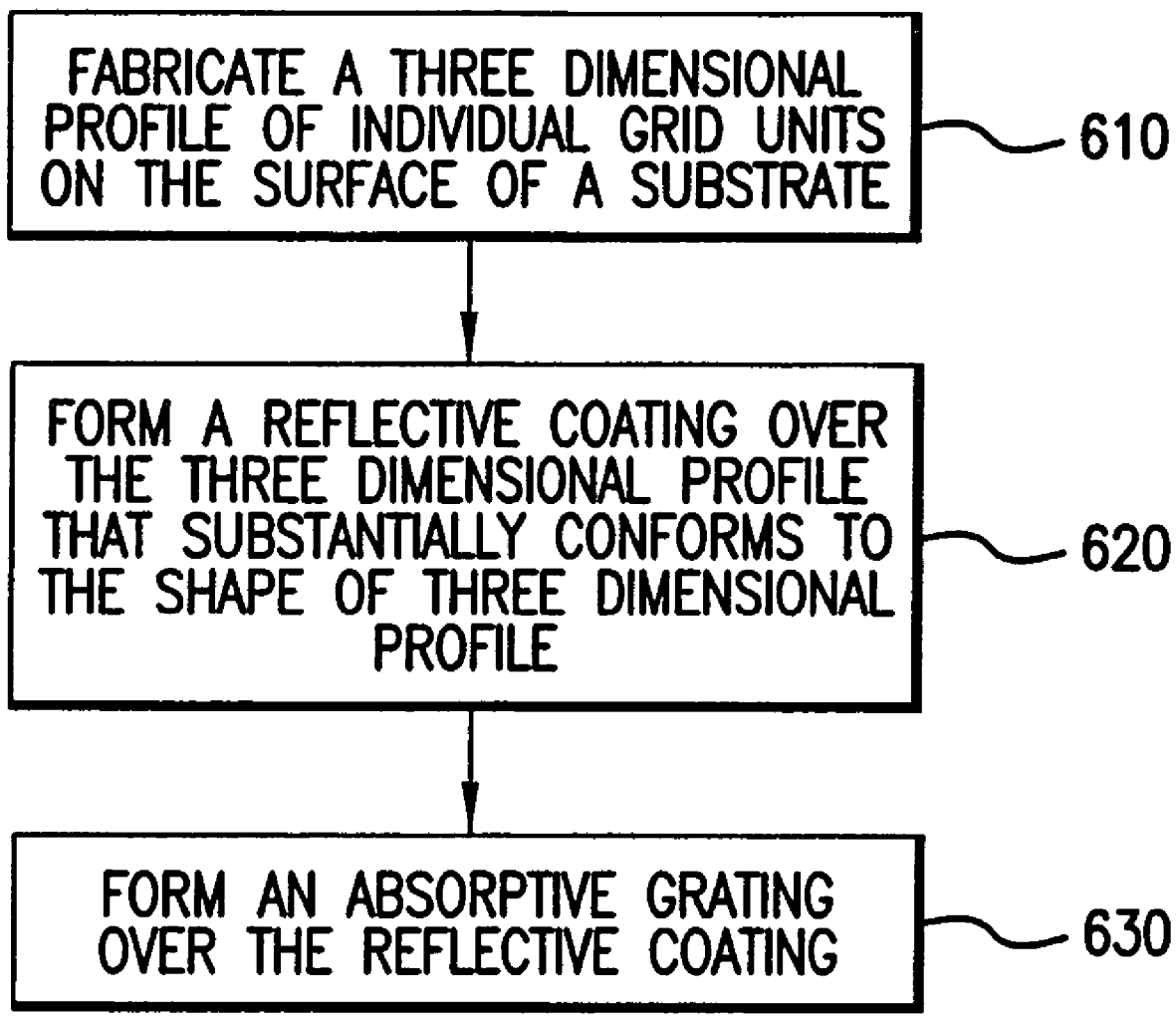
FIG. 6 illustrates a method for making a diffuser according to the present invention.

FIG. 6 illustrates a method for making the electromagnetic radiation diffuser plate 500 of the present invention (steps 610–630). Diffuser plate 500 is formed on a substrate. Typically, this substrate is a semiconductor material such as silicon or gallium arsenide.

In step 610, the three dimensional structure having individual grid units is fabricated on the substrate. As described above, the multileveled surface can be achieved by a variety of means known to those skilled in the art. For example, a series of pattern-and-etch steps on a multi-layered substrate may be used, as well as directly writing multi-level profiles into a single layer of photoresist. In one embodiment, the heights of the individual grid units are randomly selected over a predetermined range of about 50 nanometers. The particular algorithm for the random height selection depends on the wavelength of the radiation to be diffusely reflected. The smaller the wavelength, the shorter the range available for the heights of the individual grid units. In a preferred embodiment where EUV radiation is diffused, the predetermined range for the heights of the individual grid units is 50 nm. A person skilled in the relevant art would be capable of generating an algorithm to meet the criteria described above.

In step 620, a reflective coating is formed over the three dimensional profile of individual grid units. The reflective coating substantially conforms to the shape of the three dimensional profile of individual grid units upon which it rests. For EUV radiation, the reflective coating may be molybdenum silicon (MoSi). MoSi is deposited over the peak and valley profile using known techniques such as magnetron sputtering.

Finally, in step 630, an absorptive grating is formed over the reflective coating, preferably along a diagonal of the three dimensional grid. The dimensions of the absorptive grating can vary according to the specific needs of the optical diagnostics to be performed. In a preferred embodiment for use in EUV shearing interferometry, the absorptive portion of the grating is approximately 3.2 microns wide and repeats approximately every 6.4 microns. Silicon nitride is a common material for the absorptive coating.

It will be appreciated that although the discussion above is primarily in terms of a EUV lithography system, where reflective optical elements are typically used (such as the source module 115 and the sensor module 140), the invention is equally applicable to other wavelengths used in the lithographic systems having appropriate transmissive/refractive components used in place of reflective ones.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor, and thus, are not intended to limit the present invention and the appended claims in any way.

What is claimed is:

1. An electromagnetic radiation diffuser comprising:
   at least one diffuser plate each having a substrate with a first and a second surface, the first surface having a structure with a three dimensional profile of individual grid units;
   a reflective coating formed on the first surface that substantially conforms to the structure; and
   an absorptive grating formed on the reflective coating, the absorptive grating including spaces, wherein the absorptive rating absorbs a first portion of electromagnetic radiation, while a second portion of the electromagnetic radiation passing through the spaces is diffusely reflected by the reflective coating.

2. The electromagnetic radiation diffuser of claim 1, wherein the individual grid units have randomly selected heights over a predetermined range.

3. The electromagnetic radiation diffuser of claim 2, wherein the predetermined range is approximately 50 nanometers.

4. The electromagnetic radiation diffuser of claim 1, wherein the individual grid units each have an area of approximately 100 nanometers by 100 nanometers.

5. The electromagnetic radiation diffuser of claim 1, wherein the individual grid units have predetermined selected heights calculated using a mathematical algorithm.

6. The electromagnetic radiation diffuser of claim 1, wherein the absorptive grating is oriented diagonally across the individual grid units.

7. The electromagnetic radiation diffuser of claim 1, wherein the absorptive grating is approximately 3.2 microns wide and repeats approximately every 6.4 microns.

8. The electromagnetic radiation diffuser of claim 1, wherein the at least one diffuser plate includes a first diffuser plate and a second diffuser plate.

9. The electromagnetic radiation diffuser of claim 8, wherein the absorptive grating includes a first diffuser plate absorptive grating and a second diffuser plate absorptive grating.

10. The electromagnetic radiation diffuser of claim 9, wherein the first diffuser plate absorptive grating is oriented orthogonally to the second diffuser plate absorptive grating.

11. The electromagnetic radiation diffuser of claim 10, wherein the first and second diffuser plates are movable such that the first diffuser plate absorptive grating can be moved out of an optical path and the second diffuser plate absorptive grating can be placed in the optical path.

12. A method for making an electromagnetic radiation diffuser, comprising:
fabricating at least one diffuser plate by fabricating in a first surface of a substrate a three dimensional profile of individual grid units;
forming a reflective coating over the three dimensional profile that substantially conforms to the three dimensional profile; and
forming an absorptive grating over the reflective coating.

13. The method of claim 12, further comprising:
randomly selecting heights for the individual grid units; and
fabricating the individual grid units according to the randomly selected heights.

14. The method of claim 13, wherein the randomly selecting step includes randomly selecting the heights of the individual grid units such that the heights range from 0 to approximately 50 nm.

15. The method of claim 12, wherein the fabricating step includes fabricating individual grid units that have an area of approximately 100 nanometers by 100 nanometers.

16. The method of claim 12, further comprising:
calculating heights for the individual grid units using a mathematical algorithm; and
fabricating the individual grid units according to the calculated heights.

17. The method of claim 12, wherein the fabricating step includes forming the three dimensional profile using electron beam lithography.

18. The method of claim 12, wherein the fabricating step includes forming the three dimensional profile using pattern-and-etch steps.

19. The method of claim 18, wherein the fabricating step includes controlling heights of the individual grid units by etch time.

20. The method of claim 12, wherein the forming the reflective coating step includes forming the reflective coating by evaporation.

21. The method of claim 12, wherein the forming the reflective coating step includes forming the reflective coating by magnetron sputtering.

22. The method of claim 12, wherein the forming the reflective coating step includes forming the reflective coating of molybdenum silicon.

23. The method of claim 12, further comprising:
orienting the absorptive grating diagonally across the individual grid units.

24. The method of claim 12, wherein the forming the absorptive grating step includes forming an absorptive grating portion approximately 3.2 microns wide over the reflective coating and repeating the absorptive grating portion approximately every 6.4 microns.

25. The method of claim 12, wherein the forming the absorptive grating step includes forming the absorptive grating of silicon nitride.

26. The method of claim 12, wherein the fabricating step includes fabricating a first diffuser plate and a second diffuser plate.

27. The method of claim 26, wherein the forming the absorptive grating step includes forming a first diffuser plate absorptive grating and a second diffuser plate absorptive grating.

28. The method of claim 27, wherein the forming the absorptive grating step includes orienting the first diffuser plate absorptive grating orthogonally to the second diffuser plate absorptive grating.

29. The method of claim 28, wherein the fabricating step includes fabricating the first and second diffuser plates to be movable such that the first diffuser plate absorptive grating can be moved out of an optical path and the second diffuser plate absorptive grating can be placed in the optical path.

30. A lithography system comprising:
an electromagnetic radiation source;
an electromagnetic radiation diffuser positioned at a first optical plane, the electromagnetic radiation diffuser including at least one diffuser plate each having a substrate with a three dimensional profile of individual grid units that are covered by a reflective coating that substantially conforms to the substrate and that diffusely reflects electromagnetic radiation, the reflective coating covered by an absorptive grating; and
an electromagnetic radiation sensor positioned at a second optical plane,
wherein a first portion of electromagnetic radiation is absorbed by the absorptive grating, while a second portion of the electromagnetic radiation passing through spaces between the absorptive grating is diffusely reflected by the reflective coating and received at the electromagnetic radiation sensor.

31. The lithography system of claim 30, wherein the electromagnetic radiation source is an extreme ultraviolet radiation source.

32. The lithography system of claim 30, further comprising:
a source module upon which the electromagnetic radiation diffuser is mounted.

33. The lithography system of claim 32, wherein the at least one diffuser plate includes a first diffuser plate and a second diffuser plate, wherein the absorptive grating includes a first diffuser plate absorptive grating and a second diffuser plate absorptive grating, and wherein the first diffuser plate absorptive grating is oriented orthogonally to the second diffuser plate absorptive grating.

34. The lithography system of claim 33, wherein the source module is movable such that the first diffuser plate absorptive grating can be moved out of an optical path of the lithography system and the second diffuser plate absorptive grating can be placed in the optical path.

* * * * *